United States Patent
Camp et al.

(10) Patent No.: US 9,946,594 B2
(45) Date of Patent: *Apr. 17, 2018

(54) VALIDATION BITS AND OFFSETS TO REPRESENT LOGICAL PAGES SPLIT BETWEEN DATA CONTAINERS

(71) Applicant: International Business Machines Corporation, Armonk, NY (US)

(72) Inventors: Charles J. Camp, Sugar Land, TX (US); Timothy J. Fisher, Cypress, TX (US); Aaron D. Fry, Richmond, TX (US); Lincoln T. Simmons, Houston, TX (US); Adalberto G. Yanes, Sugar Land, TX (US)

(73) Assignee: International Business Machines Corporation, Armonk, NY (US)

( * ) Notice: Subject to any disclaimer, the term of this patent is extended or adjusted under 35 U.S.C. 154(b) by 41 days.

This patent is subject to a terminal disclaimer.

(21) Appl. No.: 14/829,924

(22) Filed: Aug. 19, 2015

(65) Prior Publication Data
US 2017/0052844 A1    Feb. 23, 2017

(51) Int. Cl.
*H03M 13/00* (2006.01)
*H03M 13/05* (2006.01)
(Continued)

(52) U.S. Cl.
CPC ........ *G06F 11/1008* (2013.01); *G06F 11/108* (2013.01); *G06F 11/1068* (2013.01);
(Continued)

(58) Field of Classification Search
CPC ............ G06F 11/1008; G06F 11/1044; G06F 11/1068; G06F 11/108; H03M 13/05;
(Continued)

(56) References Cited

U.S. PATENT DOCUMENTS 8,254,167 B2   8/2012 Patapoutian et al.
8,261,157 B2   9/2012 Litsyn et al.
(Continued)

OTHER PUBLICATIONS

Fukuda et al., "Non-volatile Random Access Memory and NAND Flash Memory Integrated Solid-State Drives with Adaptive Codeword Error Correcting Code for 3.6 Times Acceptable Raw Bit Error Rate Enhancement and 97% Power Reduction", Japanese Journal of Applied Physics 50 (2011) 04DE09, Received Sep. 21, 2010; accepted Dec. 11, 2010; published online Apr. 20, 2011, © 2011 the Japan Society of Applied Physics, pp. 1-8, DOI: 10.1143/JJAP.50.04DE09.

(Continued)

*Primary Examiner* — Albert Decady
*Assistant Examiner* — Christian Dorman
(74) *Attorney, Agent, or Firm* — Bryan D. Wells

(57) ABSTRACT

A flash memory codeword architecture is provided. A non-integer count of logical pages is packed into a codeword payload data container. A codeword payload header is generated. The codeword payload header includes an offset to a first logical page that is packed, at least in part, into the codeword payload data container. The codeword payload data container and the codeword payload header are concatenated to generate a codeword payload. Error-correcting code data is generated based, at least in part, on the codeword payload using a systematic error-correcting code. The codeword payload and error-correcting code data is concatenated to generate a codeword. A physical page is programmed with the codeword.

20 Claims, 6 Drawing Sheets

(51) Int. Cl.
   *G06F 11/10*      (2006.01)
   *H03M 13/29*      (2006.01)
   *G11C 29/52*      (2006.01)
(52) U.S. Cl.
   CPC .......... *G06F 11/1072* (2013.01); *G11C 29/52* (2013.01); *H03M 13/05* (2013.01); *H03M 13/2906* (2013.01); *H03M 13/611* (2013.01); *G06F 11/1044* (2013.01); *H03M 13/61* (2013.01); *H03M 13/618* (2013.01); *H03M 13/6312* (2013.01); *H03M 13/6318* (2013.01); *H03M 13/6502* (2013.01); *H03M 13/6505* (2013.01)
(58) Field of Classification Search
   CPC ............. H03M 13/2906; H03M 13/61; H03M 13/611; H03M 13/618; H03M 13/6312; H03M 13/6318; H03M 13/6502; H03M 13/6505; G11C 29/52
   See application file for complete search history.

(56) References Cited

U.S. PATENT DOCUMENTS

| | | | |
|---|---|---|---|
| 8,726,126 | B2 | 5/2014 | Post |
| 9,047,975 | B2 | 6/2015 | Sunkavalli et al. |
| 9,159,422 | B1* | 10/2015 | Lee .................... G11C 16/04 |
| 9,208,018 | B1 | 12/2015 | Northcott et al. |
| 9,483,350 | B1 | 11/2016 | Camp et al. |
| 2004/0153902 | A1 | 8/2004 | Machado et al. |
| 2009/0070657 | A1 | 3/2009 | Litsyn et al. |
| 2013/0246891 | A1* | 9/2013 | Manning .............. G06F 11/108 714/773 |
| 2014/0245097 | A1 | 8/2014 | Larsen et al. |
| 2014/0281842 | A1 | 9/2014 | Wood et al. |
| 2015/0058547 | A1 | 2/2015 | Thatcher et al. |
| 2015/0154118 | A1* | 6/2015 | Marcu ................. G06F 12/1009 711/206 |
| 2015/0212882 | A1 | 7/2015 | Manning et al. |

OTHER PUBLICATIONS

"Method of Error Correction in MBC Flash Memory", an IP.com Prior Art Database Technical Disclosure, Authors et. al.: Disclosed Anonymously, IP.com No. IPCOM000141832D, IP.com Electronic Publication: Oct. 16, 2006, pp. 1-28.

"Solid-State-RAID Stripe-Shifting to Maximize Memory-Usage", an IP.com Prior Art Database Technical Disclosure, Authors et. al.: IBM, Original Publication Date: Nov. 11, 2008, IP.com No. IPCOM000176256D, IP.com Electronic Publication: Nov. 11, 2008, pp. 1-3.

Camp et al., "Flash Memory Codeword Architectures", U.S. Appl. No. 15/408,476, filed Jan. 18, 2017, 25 pages.

Camp et al., "Flash Memory Codeword Architectures", U.S. Appl. No. 15/408,508, filed Jan. 18, 2017, 25 pages.

Appendix P, List of IBM Patents or Patent Applications Treated as Related, 2 pages, dated Jan. 19, 2017.

Appendix P, List of IBM Patents or Patent Applications Treated as Related, pp. 1-2, dated Feb. 10, 2016.

Camp et al., "Flash Memory Codeword Architectures", U.S. Appl. No. 15/014,434, filed Feb. 3, 2016, 31 pages.

* cited by examiner

VALIDATION BITS AND OFFSETS TO REPRESENT LOGICAL PAGES SPLIT BETWEEN DATA CONTAINERS

BACKGROUND OF THE INVENTION

The present invention relates generally to the field of data processing and storage, and more particularly to flash memory codeword architectures.

Memory devices are typically provided as internal integrated circuits in computers and other electronic devices. There are many different types of memory including volatile and non-volatile memory. Volatile memory typically requires power to maintain data (e.g., user data or error-correcting data). Non-volatile memory can provide persistent data by retaining stored data when not powered and can include NAND flash memory, NOR flash memory, read only memory (ROM), and electrically erasable programmable ROM (EEPROM), among various other types of memory.

Memory devices can be combined together to form a storage volume of a memory system such as a solid state drive (SSD). Solid state drives generally include NAND flash memory and/or NOR flash memory and controllers that utilize smaller amounts of volatile memory (e.g., dynamic random access memory) in the form of buffers and/or caches. Solid state drives incorporating NAND flash memory increasingly replace or supplement hard disk drives (HDDs) in various computing devices due to advantages in terms of performance, size, weight, ruggedness, operating temperature range, and power consumption. In general, SSDs significantly outperform HDDs in terms of I/O performance due, at least in part, to a lack of moving parts that eliminates seek times and other electro-mechanical delays that reduce HDD performance.

SUMMARY

According to one embodiment of the present disclosure, a method for programming flash memory is provided. The method includes packing, by one or more storage controllers, a non-integer count of logical pages into a codeword payload data container; generating, by one or more storage controllers, a codeword payload header that includes an offset to a first logical page packed, at least in part, into the codeword payload data container; concatenating, by one or more storage controllers, the codeword payload data container and the codeword payload header to generate a codeword payload; generating, by one or more storage controllers, error-correcting code data based, at least in part, on the codeword payload using a systematic error-correcting code; concatenating, by one or more storage controllers, the codeword payload and error-correcting code data to generate a codeword; and programming, by one or more storage controllers, a physical page with the codeword.

According to another embodiment of the present disclosure, a computer program product for programming flash memory is provided. The computer program product comprises a computer readable storage medium and program instructions stored on the computer readable storage medium. The program instructions include program instructions to program instructions to pack a non-integer count of logical pages into a codeword payload data container; program instructions to generate a codeword payload header that includes an offset to a first logical page packed, at least in part, into the codeword payload data container; program instructions to concatenate the codeword payload data container and the codeword payload header to generate a codeword payload; program instructions to generate error-correcting code data based, at least in part, on the codeword payload using a systematic error-correcting code; program instructions to concatenate the codeword payload and error-correcting code data to generate a codeword; and program instructions to program a physical page with the codeword.

According to another embodiment of the present disclosure, a computer system for programming flash memory is provided. The computer system includes one or more storage controllers, one or more computer readable storage media, and program instructions stored on the computer readable storage media for execution by at least one of the one or more storage controllers. The program instructions include program instructions to program instructions to pack a non-integer count of logical pages into a codeword payload data container; program instructions to generate a codeword payload header that includes an offset to a first logical page packed, at least in part, into the codeword payload data container; program instructions to concatenate the codeword payload data container and the codeword payload header to generate a codeword payload; program instructions to generate error-correcting code data based, at least in part, on the codeword payload using a systematic error-correcting code; program instructions to concatenate the codeword payload and error-correcting code data to generate a codeword; and program instructions to program a physical page with the codeword.

DETAILED DESCRIPTION

Figure 1:
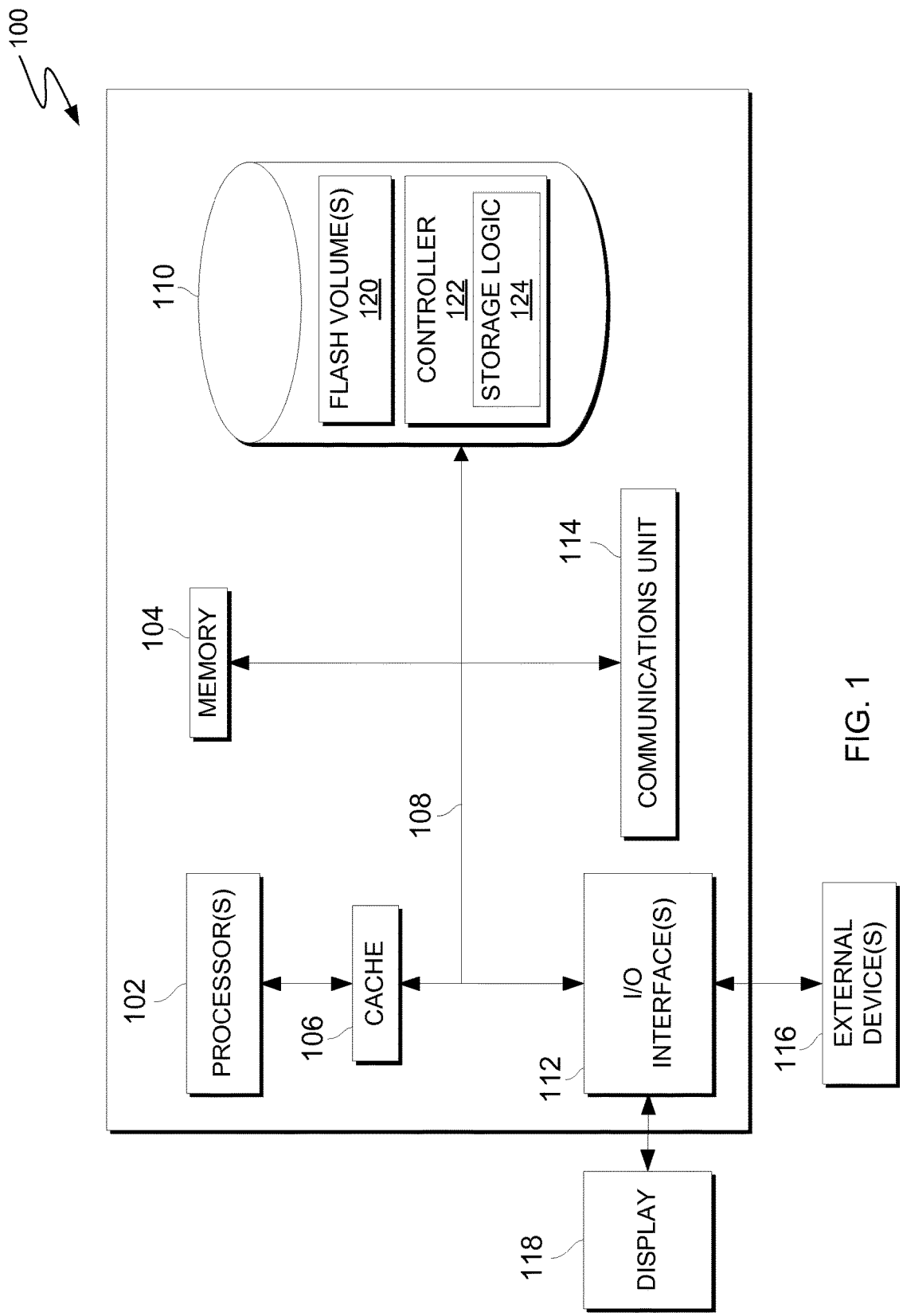
FIG. 1 is a block diagram of a computer system, in accordance with an embodiment of the present disclosure.

A logical page is a fixed-length contiguous block of virtual memory. In general, it is the smallest unit of data that has an address in virtual memory. Virtual memory enables operating systems to utilize a virtual address space that is larger than the physical address space available in backing computer storage media (e.g., random-access memory, flash memory, or magnetic hard disk drives). Using the virtual address space, operating systems are able to provide processes with the illusion that large, contiguous sections of the virtual address space are available to the processes. In reality, data that corresponds to a contiguous range of virtual memory addresses can be stored at discontiguous physical addresses in memory and/or paged out to non-volatile computer storage media (e.g., flash memory and/or hard disk drives).

In a flash memory device, such as a SSD that includes NAND flash memory, data corresponding to virtual addresses is stored by programming individual cells. In NAND devices, cells are the smallest unit in an organizational hierarchy that includes pages, blocks, planes, and dies. Flash memory devices typically include single-level cells, multi-level cells, or triple-level cells. A single-level cell can store one bit of data, a multi-level cell can store two bits of data, and a triple-level cell can store three bits of data. In NAND devices, cells are organized into pages of various sizes. Typical page sizes include five hundred and twelve bytes, two kilobytes, four kilobytes, eight kilobytes, and sixteen kilobytes. In addition, a few bytes of data (e.g., 1/32 of the page size) are generally associated with each NAND page for storage of control and error-correcting code (ECC) data. Similarly, pages are organized into blocks of various sizes. Typical block sizes include thirty-two pages, sixty-four pages, and one hundred and twenty-eight pages of various sizes plus the associated control and ECC data.

In a NAND device, read operations are performed on a page basis, and it is not possible to read less than one page. Consequently, a read operation generally returns more information than requested. Write operations are also performed on a page basis in NAND devices, and it is not possible to write (i.e., program) less than a full page, even if less than all bytes in the page are affected by the write operation. Unlike read and write operations, erasures are performed on a block basis. In NAND devices, it is not possible to erase less than one full block.

Embodiments of the present disclosure recognize that, in at least some cases, physical page sizes are larger than logical page sizes. While some instruction set architectures support logical page sizes of sixty-four kilobytes or more, four kilobytes (i.e., 4,096 bytes) is a common default page size. Similarly, a physical page size of four kilobytes is common. In general, it is beneficial to provision a system such that logical pages and physical pages are of the same size. Due to smaller manufacturing processing nodes and the introduction of multi-level cells and triple-level cells, however, larger physical page sizes (e.g., page sizes of eight and sixteen kilobytes) are increasingly common. In addition, physical page sizes are increasingly a non-integer multiple of logical page sizes, and physical page sizes generally differ between suppliers. In systems where physical page sizes are larger than logical page sizes, inefficiencies can exist. Embodiments of the present disclosure provide a flash memory architecture that uses codewords to support efficient use of physical page sizes that are larger than logical page sizes.

The present disclosure will now be described in detail with reference to the Figures. FIG. 1 is a block diagram of computer system, in accordance with an embodiment of the present disclosure. Computer system 100 includes communications fabric 108, which provides communications between computer processor(s) 102, memory 104, persistent storage 110, communications unit 114, and input/output (I/O) interface(s) 112. Communications fabric 108 can be implemented with any architecture designed for passing data and/or control information between processors (such as microprocessors, communications and network processors, etc.), system memory, peripheral devices, and any other hardware components within a system. For example, communications fabric 108 can be implemented with one or more buses.

Memory 104 and persistent storage 110 are computer readable storage media. In various embodiments, memory 104 includes random access memory (RAM). In general, memory 104 can include any suitable volatile or non-volatile computer readable storage media. Cache 106 is a fast memory that enhances the performance of processors 102 by holding recently accessed data and data near accessed data from memory 104.

Program instructions and data can be stored in persistent storage 110 for execution by one or more of the processors 102 via cache 106 and memory 104. Persistent storage 110 includes one or more logical volumes of NAND flash memory (i.e., flash volume(s) 120) and controller 122. Persistent storage 110 also stores storage logic 124. As described herein, controller 122 executes storage logic 124 to, at least in part, manage flash volume(s) 120. In some embodiments, persistent storage 110 includes a local cache (i.e., a cache that is separate from cache 106) that can store, among other things, instructions that enable controller 122 to execute storage logic 124. In some embodiments, persistent storage 110 is an SSD. In such embodiments, flash volume(s) 120 represent one or more volumes of the SSD, controller 122 represents a controller of the SSD, and storage logic 124 resides on controller 122 (or is otherwise accessible to and executable by controller 122). For example, controller 122 may represent a processing unit of persistent storage 110 that is communicatively connected to and controls flash volume(s) 120. In other embodiments, persistent storage 110 includes a plurality of SSDs (e.g., a homogenous array of SSDs or a heterogeneous array of SSDs and HDDs). In embodiments that include a plurality of SSDs, one or more SSDs of the plurality can include an instance of controller 122 that has an instance of and executes storage logic 124 to store data that is allocated to the respective SSD. In yet other embodiments, persistent storage 110 is a hybrid drive that includes one or more logical volumes of flash memory (i.e., flash volumes 120) and one or more logical volumes that reside on hard disk(s).

Communications unit 114, in these examples, provides for communications with other data processing systems or devices. In these examples, communications unit 114 includes one or more network interface cards. Communications unit 114 may provide communications through the use of either or both physical and wireless communications links. Program instructions and data used to practice embodiments of the present invention and storage logic 124 may be downloaded to persistent storage 110 through communications unit 114.

I/O interface(s) 112 allows for input and output of data with other devices that may be connected to each computer system. For example, I/O interface 112 may provide a connection to external devices 116 such as a keyboard, keypad, a touch screen, and/or some other suitable input device. External devices 116 can also include portable computer readable storage media such as, for example, thumb drives, portable optical or magnetic disks, and memory cards. Software and data used to practice embodiments of the present invention can be stored on such portable computer readable storage media and can be loaded onto persistent storage 110 via I/O interface(s) 112. I/O interface(s) 112 also connect to a display 118.

Display 118 provides a mechanism to display data to a user and may be, for example, a computer monitor.

Figure 2:
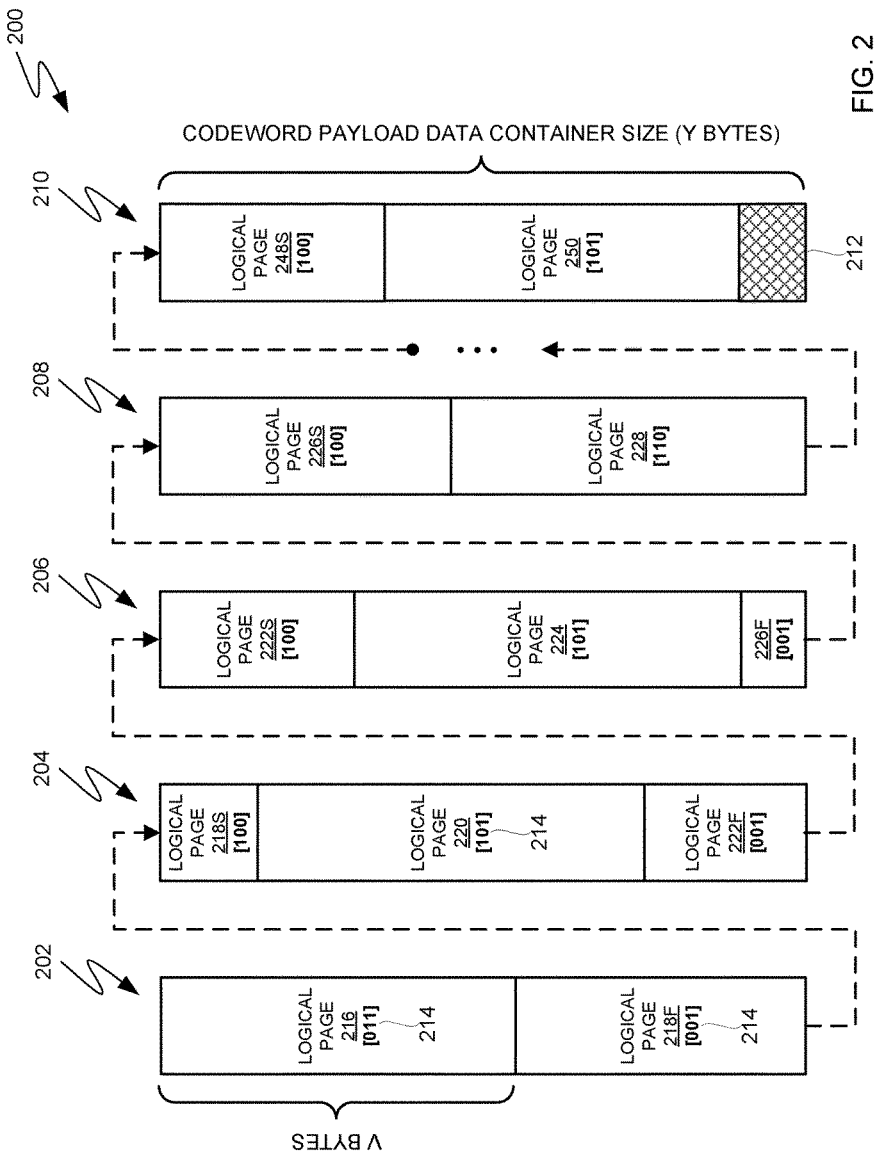
FIG. 2 is a diagram that depicts a packing system for packing logical pages into codeword payload data containers, in accordance with an embodiment of the present disclosure.

FIG. 2 is a diagram that depicts a packing system for packing logical pages into codeword payload data containers, in accordance with an embodiment of the present disclosure. For example, packing system 200 is a system in which codeword payload data containers can include non-integer counts of logical pages. Codeword payload data containers 202, 204, 206, 208, 210 represent a range of codeword payload data containers within one block of memory that includes a total of n codeword payload data containers into which m logical pages are packed, as described herein. Logical pages 216, 218F/S, 220, 222F/S, 224, 226F/S, 228, 248S, and 250 are examples of the m logical pages that are packed into the range of n codeword payload data containers that includes codeword payload data containers 202, 204, 206, 208, and 210. The codeword payload data containers and the logical pages are sized such that the codeword payload data containers are not divisible by the logical pages. Consequently, logical pages that are not self-contained must straddle at least some boundaries between codeword payload data containers. Packing system 200, however, prohibits logical pages from straddling the across the second boundary of the final codeword payload data container in a block of flash memory (i.e., logical pages cannot straddle across blocks of memory). Accordingly, codeword payload data container 210 includes unused space 212 because codeword payload data container 210 is the final codeword payload container in the memory block. In the event that the number of logical pages in a block equals one plus a second value, wherein the second value is a common multiplier of the size of a logical page and the size of a codeword payload data container, then the first boundary of the last codeword payload data container will align with the last logical page. In this circumstance, it is possible for the last codeword payload data container in a block (i.e., the last codeword in a block) to store an integer count of logical pages to prevent straddling across a block boundary. For example, the last codeword payload data container in a block could store a single self-contained logical page that is aligned with the first boundary of the codeword payload data container and include unused space in the remaining portion of the codeword payload data container.

In the embodiment depicted in FIG. 2, the size of the logical pages is v bytes and the size of the codeword payload data containers is x bytes. In general, the logical pages and codeword payload data containers are sized such that the codeword payload data containers can include a non-integer count of logical pages. While the codeword payload data containers and logical pages are not drawn to scale in FIG. 2, codeword payload data containers 202, 204, and 208 depict three ways in which logical pages can be arranged with respect to codeword payload data container boundaries. In codeword payload data container 202, for example, logical page 216 is aligned with the first boundary of the container and does not straddle container boundaries (i.e., logical page 216 is self-contained). The first portion of the subsequent logical page (i.e., logical page 218F) straddles out of codeword payload data container 202 and across the boundary between codeword payload data containers 202 and 204. Consequently, the second portion of the logical page (i.e., logical page 218S) straddles into codeword payload data container 204. In codeword payload data container 204, logical page 220 is not aligned with either the first boundary or the second boundary of the container, but it does not straddle out of the container (i.e., logical page 220 is self-contained). The subsequent logical page, however, straddles across codeword payload data containers 204 and 206. Accordingly, logical page 222F (i.e., the first portion of logical page 222) is stored in the remainder of codeword payload data container 204, and codeword payload data container 206 includes logical page 222S (i.e., the second portion of logical page 222). Similarly, logical page 224 is not aligned with either the first or second boundaries of codeword payload data container 206 but does not straddle across container boundaries (i.e., logical page 224 is similarly self-contained). Codeword payload data container 206 also includes logical page 226F. Codeword payload data container 208 depicts another possible alignment of logical pages and codeword payload data containers. In codeword payload data container 208, the second portion of logical page 226 (i.e., logical page 226S) straddles into codeword payload data container 208 such that logical page 228 is aligned with the second boundary of codeword payload data container 208 and does not straddle out of the container (i.e., logical page 228 is self-contained). In addition to the arrangements of logical pages depicted in FIG. 2, it is also possible that a codeword payload data container includes a second portion of a first logical page and a first portion of a second logical page such that no logical page is self-contained within the codeword payload data container. The ratio of logical page size to codeword payload data container size determines, at least in part, how logical pages are arranged with respect to codeword payload data container boundaries.

In FIG. 2, codeword payload data container 210 represents the final codeword payload data container within a block of flash memory. Because flash memory is typically erased in blocks, logical pages are not permitted to straddle across block boundaries. In the embodiment depicted in FIG. 2, the size ratio of logical pages to codeword payload data containers, the number of codeword per physical page, and the number of physical pages per block of memory is such that codeword payload data container 210 includes unused space 212, in addition to logical pages 248S and 250, to prevent straddling across block boundaries. In other embodiments, however, the size ratio, the number of codewords per physical page, and the number of physical pages per block is such that logical pages align with the block boundaries such that unused space is not required to prevent straddling across block boundaries.

Figure 3:
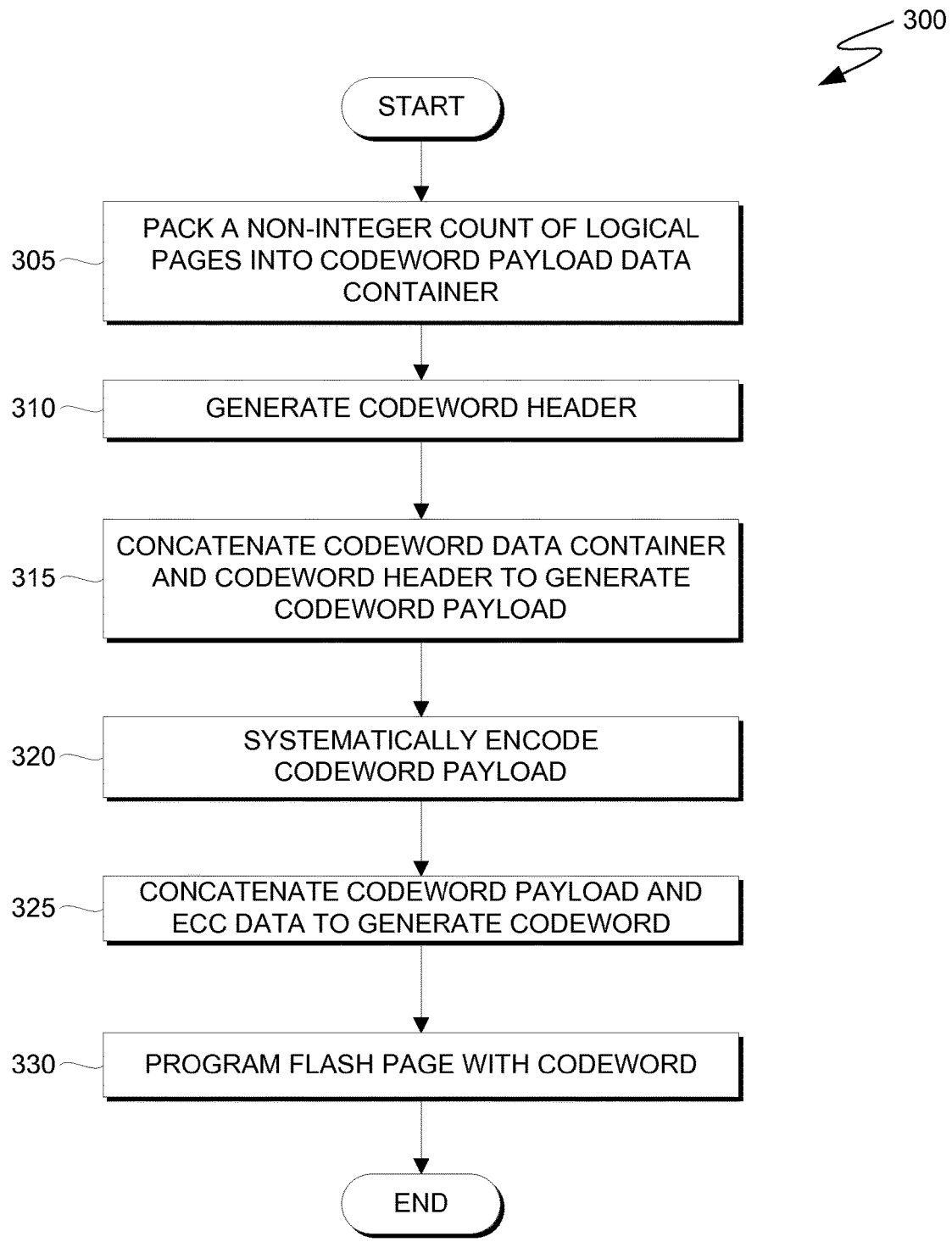
FIG. 3 is a flowchart depicting a method of programming physical pages with codewords, in accordance with an embodiment of the present disclosure.

FIG. 3 is a flowchart depicting a method of programming physical pages with codewords, in accordance with an embodiment of the present disclosure. Storage logic 124 includes method 300. Controller 122 executes storage logic 124 to perform method 300 and thereby program pages in flash volume(s) 120 with codewords, as described herein.

Method 300 includes packing a non-integer count of logical pages into a codeword payload data container (305), as described herein with respect to FIG. 2. Based, at least in part, on how the logical pages are packed into the codeword payload data container, one or more offset values are calculated. In general, an offset value indicates the position of the first memory cell of a logical page in relation to the first boundary of the codeword payload data container. The offset value also defines the boundary between two logical pages in a codeword payload data container. In some embodiments, the offset value is a value that describes the memory cell that stores the first bit of the first logical page that does not straddle into the codeword payload data container (i.e., a self-contained logical page or a logical page that straddles out of the codeword payload data container). If, for example, the offset value is zero, the first logical page in the codeword payload data container is aligned with the first boundary of the codeword payload data container (e.g., logical page 216 in FIG. 2). If the offset value is non-zero, the logical page can be self-contained within the codeword payload data container or straddle out of the codeword payload data container. Depending on the non-zero offset value, the size of the logical pages, and the size of the codeword payload data container, the self-contained logical page can be aligned with second boundary of the logical page or allow an integer or non-integer count of additional logical pages to be stored in the remainder of the codeword payload data container. For example, the additional logical pages could be a portion of a logical page that straddles out of the codeword payload data container, one or more self-contained logical pages, or one or more self-contained logical pages and a portion of a logical page that straddles out of the codeword payload data container. Using the offset value and the size of a logical page, it is possible to determine the offset to any logical page that does not straddle into the codeword payload data container. Accordingly, only the offset value to the first logical page that does not straddle into the codeword payload data container is calculated in some embodiments. In other embodiments, however, offset values to any page that is self-contained or that straddles out of the codeword payload data container is calculated.

Based, at least in part, on the offset value(s) described above, a codeword payload header is generated (310) that includes the offset value(s). In some embodiments, the codeword payload header also includes the physical address of the physical page in flash memory that will be programmed with the codeword produced by method 300. In such embodiments, the physical address in the codeword payload header can be compared to the physical address referenced in read commands in order to provide a validation check.

Codeword payload data containers are concatenated with codeword payload headers to generate a codeword payload (315). The codeword payload is systematically encoded to generate a codeword (320). By using systematic codes, the codeword payload is embedded in the output. Systematic codes are advantageous in this application because the error-correcting code (ECC) data can be concatenated with the codeword payload to generate the codeword (325). In addition, the offset value(s) in the codeword payload header are preserved. The codeword payload can be encoded using systematic Hamming codes, systematic Reed-Solomon codes, or another systematic error-correcting code known in the art. While the specific code used to generate the ECC data is not a limitation of the present disclosure, the size of the resulting ECC data can influence, among other things, the size of the codeword payload data containers and codeword payload headers.

To store the codeword in persistent storage 110, controller 122 programs a page in flash volume(s) 120 with the codeword (330). Depending on the size of the codeword and the size of the page in flash volume(s) 120, two or more codewords can be programed into the page.

In embodiments like the one depicted in FIG. 2, the codeword payload data containers and the logical pages are sized such that no more than one logical page can be self-contained within each codeword payload data container. As described herein, five scenarios exist that describe how logical pages can be arranged in such embodiments. In some embodiments, a set of three binary validation bits 214, wherein a programmed bit is represented by a zero, describes the five scenarios. For example, the scenario in which a logical page is aligned with the first boundary of a codeword payload data container (e.g., logical page 216) can be represented by a set of three bits 214 having values of [011] (i.e., a single zero indicates a self-contained logical page). Similarly, the scenario in which a logical page is aligned with the second boundary of a codeword payload data container (e.g., logical page 228) can be represented by a set of three bits 214 having values of [110]. The scenario in which a logical page is self-contained in the codeword payload data container but not aligned with a boundary can be represented by a set of three bits 214 having values of [101] (i.e., the first bit is associated with a first boundary of a logical page and the third bit is associated with the second boundary of the logical page). As described herein, it is also possible that a logical page straddles two codeword payload data containers. In this scenario, two codewords and two sets of validation bits 214 are needed to describe the arrangement of the two portions of the logical page. For example, a set of three bits 214 having values of [001] can represent the portion of the logical page that straddles out of a first codeword payload data container (i.e., a first portion of the logical page). Similarly, a set of three bits 214 having values of [100] can represent the portion of the logical page that straddles into a second codeword payload data container (i.e., a second portion of the logical page). In these representations, the two programmed bits (i.e., the two zeros) indicate straddling and the position of the unaltered bit (i.e., the one) indicates whether the logical page straddles into or out of the corresponding codeword.

In other embodiments, a set of two binary validation bits describes four of the five scenarios. In one example of a two-bit system, a set of two bits having values of [00] represents three scenarios in which a logical page is self-contained. By comparing the offset to the sizes of the logical pages and/or codeword payload data containers, it is possible to determine whether the self-contained page is (1) aligned with the first boundary of the codeword payload data container (e.g., the offset to logical page 218F in FIG. 2 is V+1 bytes), (2) aligned with the second boundary of the codeword payload data container (e.g., the offset to logical page 228 is Y-V bytes), or (3) aligned with neither the first nor second boundary of the codeword payload data container (e.g., the offset of logical page 220 is less than Y-V bytes). In this example of a two-bit system, a set of two bits having values [10] represents the scenario in which a logical page straddles into a codeword payload data container, and a set of two bits having values of [01] represents the scenario in which a logical page straddles out of a codeword payload data container. Reading a logical page that straddles codeword payload data containers involves a reference to more than one codeword, as described herein. Based, at least in part, on the referenced codewords (e.g., the order of the codewords), controller 122 executes storage logic 124 to determine the size of the first portion of the logical page (e.g., logical page 218F) and the size of the second portion of the logical page (e.g., logical page 218S) based, at least in part, on the offsets associated with the two codewords (e.g., the codewords that include codeword payload data containers 202 and 204).

In another example of a two-bit system: (1) a set of two bits having values of [00] represents the scenario in which a self-contained logical page is aligned with neither the first nor second boundaries of a codeword payload data container; (2) sets of two bits having values of [01] and [10] respectively represent the scenarios in which a self-contained logical page is aligned with the first and second boundaries of a codeword payload data container; and (3) a set of two bits having values of [11] represents the scenarios in which a logical page straddles across the boundaries of codeword payload data containers. Based, at least in part, on the referenced codewords (e.g., the order of the codewords) and the associated offsets, controller 122 executes storage logic 124 to determine the location and size of a first portion of the logical page (e.g., logical page 218F) and the location and size of a second portion of the logical page (e.g., logical page 218S). This example of a two-bit system, as well as the three-bit system described herein, advantageously enable the recovery of at least some logical pages in situations where the offset values are corrupted or otherwise unavailable. For example, logical pages that align with a first boundary of a codeword payload data container (e.g., logical pages associated with validation bit sets [01] or [011]) can be recovered using the validation bits and knowledge of the size of a logical page. Similarly, logical pages that align with a second boundary of a codeword payload data container (e.g., logical pages associated with validation bit sets [10] or [110]) can be recovered using the validation bits and knowledge of the sizes of a logical page and a codeword payload data container. In situations where a logical page straddles boundaries between codeword payload containers, it is possible to extract both the first and second portions of the logical page if the offset associated with one of the two respective codewords is available.

The three validation bit systems described herein are examples of various validation bit systems, and permutations of the validation bit systems described herein are possible without departing from the scope of the present disclosure. In addition, more validation bits can be added to support codeword payload data containers that can include two or more self-contained logical pages (e.g., a set of four validation bits to describe codeword payload data containers that can include two self-contained logical pages).

In addition to programming page(s) in flash volume(s) 120, controller 122 manages one or more data repositories that associate each logical page stored in flash volume(s) 120 with the page(s) on which they are stored, the codeword(s) that describe them, and the set(s) of validation bits that describe how the logical pages are arranged in the codeword(s). For example, controller 122 can manage one or more of a flash translation layer, a page-level map, a block-level map, a log-block map or another mapping system that computer system 100 and/or persistent storage 110 can use to access logical pages stored in flash volume(s) 120.

Figure 4:
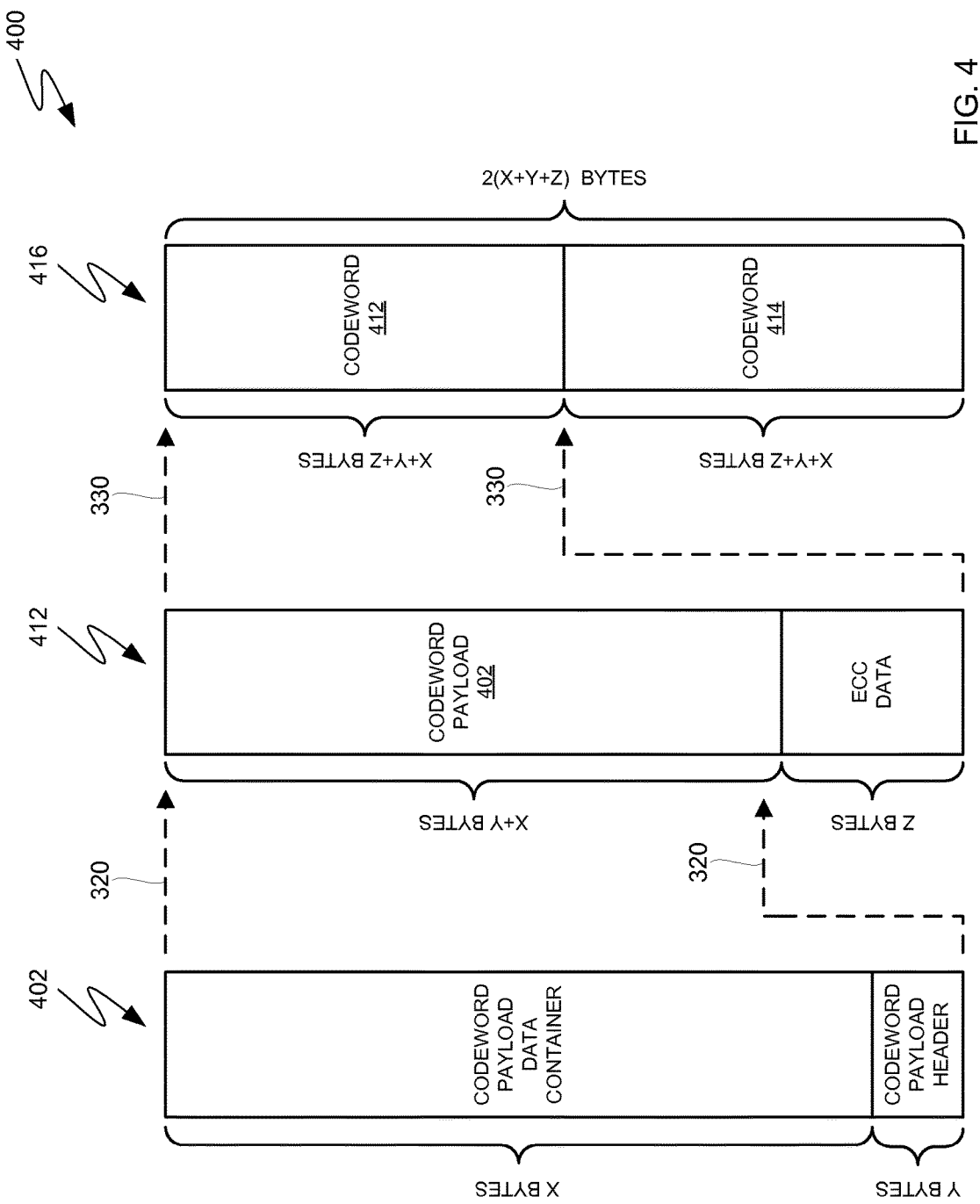
FIG. 4 is a block diagram that depicts the transformation of a codeword payload data container into a codeword that is programmed into flash memory, in accordance with an embodiment of the present disclosure.

FIG. 4 is a block diagram that depicts the transformation of a codeword payload data container into a codeword that is programmed into flash memory, in accordance with an embodiment of the present disclosure. Transformation 400 depicts the results of various operations of method 300 as applied to the embodiment depicted in FIG. 2.

In FIG. 4, codeword payload 402 is depicted as a codeword payload data container of x bytes that is concatenated with a codeword payload header of y bytes. As shown in FIG. 4, codeword payload 402 has a size of x+y bytes. Encoding (320) codeword payload 402 generates z bytes of ECC data. Accordingly, codeword payload 402 and the ECC data are concatenated to generate codeword 412 that has a size of x+y+z bytes. Codeword 412 is programmed (330) into physical page 416. In the embodiment depicted in FIG. 4, physical page 416 has a size of 2(x+y+z) bytes and stores codeword 412 and codeword 414. Like codeword 412, codeword 414 has a size of x+y+z bytes and is generated using a different instance of method 300 that operates on a different codeword payload data container.

Figure 5A:
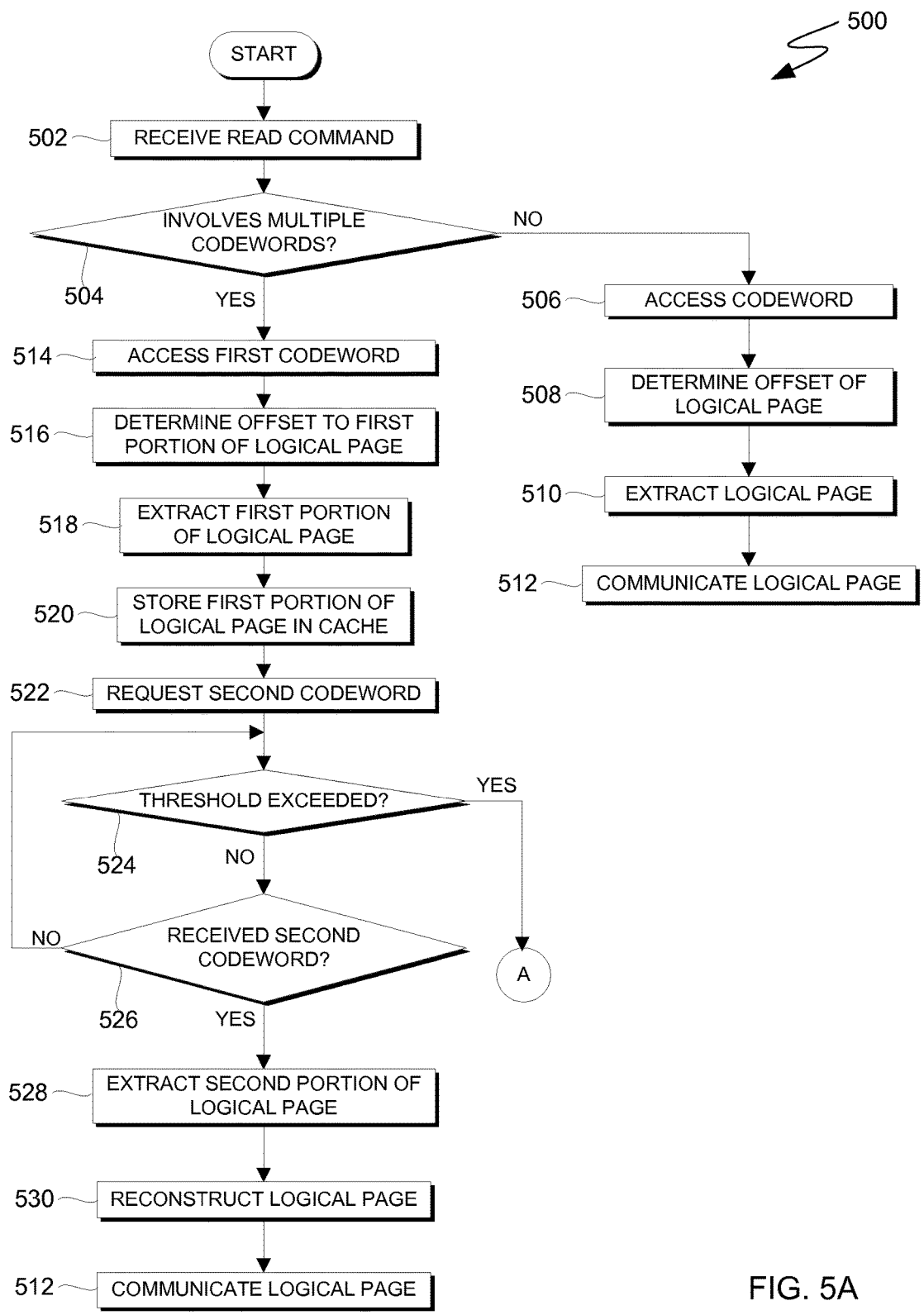
FIGS. 5A and 5B are flowcharts that depict a method of accessing logical pages that are associated with one or more codewords, in accordance with an embodiment of the present disclosure.
Figure 5B:
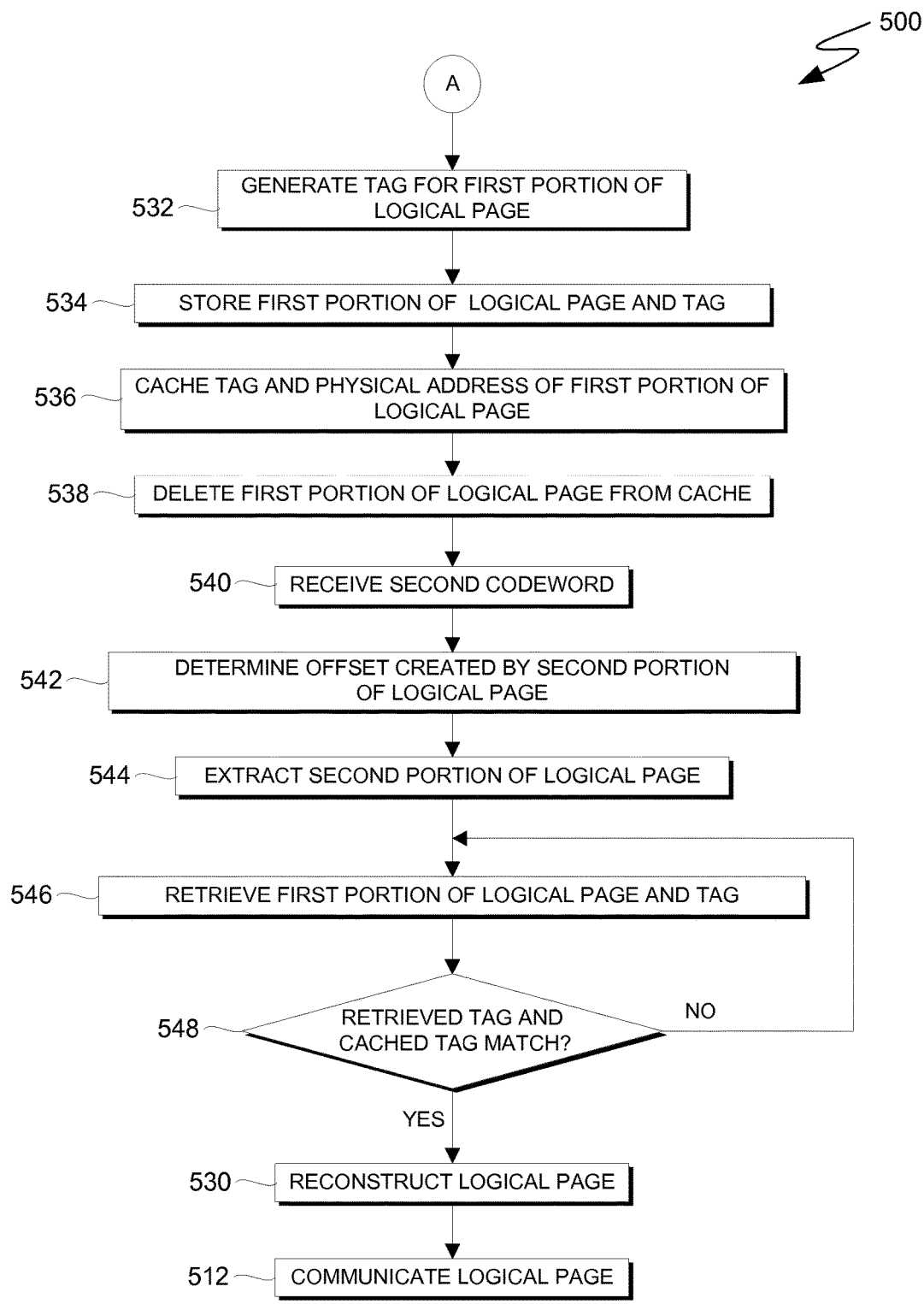

FIGS. 5A and 5B are flowcharts that depict a method of accessing logical pages that are associated with one or more codewords, in accordance with an embodiment of the present disclosure. Storage logic 124 includes method 500, which controller 122 executes to access (i.e., read) various logical pages in flash volume(s) 120. In the embodiment depicted in FIGS. 5A and 5B, the codewords (i.e., the codeword payload data containers) and logical pages are sized such that a codeword can include, at most, one self-contained logical page.

In response to receiving a command to read a logical page (502) in flash volume(s) 120, controller 122 determines if the read command involves multiple codewords (504). In various embodiments, controller 122 determines if the read command involves multiple codewords by searching one or more data repositories such as a flash translation layer, a page-level map, a block-level map, a log-block map or another mapping system for the logical page. If the read command involves multiple codewords, the logical page will be associated with more than one codeword (and corresponding pages in flash volume(s) 120) and more than one corresponding set(s) of validation bits in the aforementioned repositories.

If controller 122 determines that the logical page is associated with a single codeword (decision 504, NO branch), controller 122 accesses the codeword (506) on a mapped page of flash volume(s) 120. In the embodiment depicted in FIG. 5A, controller 122 accesses the codeword payload header to determine the offset to the logical page (508). Because the read involves a single codeword, the offset will identify the beginning of the logical page that is referenced in the read command because the logical page is necessarily self-contained in the codeword in this embodiment. Using the offset and the size of a complete logical page, controller 122 extracts the self-contained logical page from the code word (510) and communicates the logical page to processors (102) and/or another computing device that is connected to computer system 100 (512).

If controller 122 determines that the logical page is associated with multiple codewords (decision 504, YES branch), controller 122 accesses the first codeword. In the embodiment depicted in FIGS. 5A and 5B, the first codeword includes the first portion of the logical page referenced in the read command. In order to calculate the offset to the first portion of the logical page, controller 122 access the codeword payload header. Using the offset, controller 122 determines whether the offset alone or the offset plus the logical page size identifies the first portion of the logical page (516). The offset alone will identify the first portion of the logical page if the offset plus the logical page size exceeds the logical page size. Based, at least in part, on the determination of the offset to the first portion of the logical page (i.e., the offset stored in the codeword payload header with or without adding the size of logical page), controller 122 extracts the first portion of the logical page from the first codeword (518) and stores the first portion of the logical page in a cache or buffer that is included in persistent storage 110 (520). If persistent storage 110 does not include a cache or buffer, controller 122 interacts with processor(s) 102 or another component of computer system 100 to facilitate storage of the first portion of the logical page in memory 104 (i.e., main/system memory).

If a logical page straddles two codewords, it is possible that the logical page straddles two pages in flash volume(s) 120. In general, there is no guarantee that the process of accessing a first page in flash volume(s) 120 and accessing a second page in flash volume(s) will complete in order. Consequently, reading a logical page that straddles pages in flash volume(s) 120 can incur significantly more latency than reading a logical page that straddles two codewords of a single page in flash volume(s) 120. After requesting the second codeword (522), controller 122 determines if a time threshold has been exceeded prior to receiving the second codeword from flash volume(s) 120 (524). The second codeword is the codeword that includes a second portion of the logical page. The second portion of the logical page is the portion of the logical page that straddles into a codeword. In some embodiments, the time threshold is set such that times greater than the threshold require holding the first portion of the logical page in cache for an unacceptable amount of time. In other embodiments, the time threshold is set based, at least in part, on other parameters that determine whether or not latencies and/or resource utilization is unacceptable. In some embodiments where latencies and/or resource utilization is not important in this context, operations relating and subsequent to this determination (i.e., decision 524, YES branch) are omitted. If controller 122 determines that the threshold is not exceeded (decision 524, NO branch), controller 122 determines whether or not it has received the second codeword from flash volume(s) 120. If controller 122 determines that is has not received the second codeword (decision 526, NO branch), controller 122 will determine whether or not the threshold is exceeded (524) and whether or not it has received the second codeword from flash volumes(s) 120 until the threshold is exceeded or controller 122 receives the second codeword.

If controller 122 determines that it has received the second codeword from flash volume(s) 120 (decision 526, YES branch), controller 122 extracts the second portion of the logical page (528). Controller 122 extracts the second portion of the logical page by accessing the codeword payload header of the second codeword to obtain the offset to the first self-contained logical page or to the boundary between the second portion of the logical page and a logical page that straddles or is aligned with the second boundary of the second codeword. Using the offset, controller 122 derives the size of the second portion of the logical page. Using the first and second portions of the logical page, controller 122 reconstructs the logical page (530) and communicates the logical page to processors (102) and/or another computing device that is connected to computer system 100 (512).

If controller 122 determines that the threshold has been exceeded (decision 524, YES branch), controller 122 generates a tag for the first portion of the logical page (532). The tag is associated the uncompleted read operation and is used to distinguish the uncompleted read operation from subsequent read operations to the same logical page. In some embodiments, the tag is a time stamp. In other embodiments, the tag is another identifier that is used to distinguish the uncompleted read operation. Controller 122 stores the first portion of the logical page and a copy of the tag for later use (534). In embodiments where persistent storage 110 includes a buffer of volatile memory (e.g., a DRAM buffer) that is not also a cache for controller 122, controller 122 stores the first portion of the logical page and the tag in the buffer. In other embodiments, controller 122 interacts with processor(s) 102 or another component of computer system 100 to facilitate storage of the first portion of the logical page in memory 104 (i.e., main/system memory). Controller 122 retains, in cache, a copy of the tag and the physical or logical address where the first portion of the logical page is stored (536). To, at least in part, free resources for other read operations, garbage collection, or other processes in persistent storage 110, controller 122 deletes the first portion of the logical page from cache (538).

After receiving the second codeword (540), controller 122 determines the offset created by the second portion of the logical page (542). To determine the offset, controller 122 accesses the codeword payload header of the second codeword to obtain the offset to the first self-contained logical page or to the boundary between the second portion of the logical page and a logical page that straddles or the second boundary of the second codeword. Using the offset, controller 122 derives the size of the second portion of the logical page and extracts the second portion of the logical page from the second codeword (544). To reconstruct the logical page, controller 122 retrieves the first portion of the logical page and the tag (546) using the address stored in cache. To ensure that retrieved first portion of the logical page is associated with the read operation that retrieved the second portion of the logical page, controller determines whether or not the retrieved tag and the cached tag match (548). If the controller 122 determines that the tags do not match (decision 548, NO branch), controller retrieves portions of logical pages and corresponding tags until controller 122 determines that the tags match. In some embodiments, controller 122 can retrieve any portions of any logical pages that are stored in the data repository from which the first portion of the logical page was initially retrieved. In other embodiments, the tag or other information (e.g., the codeword, logical page address, or the address of associated page in flash volume(s) 120) is stored with the first portion of the logical page before it is deleted from cache (538) to, at least in part, reduce the latency of the read operation. If controller 122 determines that the tags match, controller 122 reconstructs the logical page using the first and second portions of the logical page (530) and communicates the logical page to processors (102) and/or another computing device that is connected to computer system 100 (512).

In addition, controller 122 is capable of reading physical pages from flash volume(s) 120 directly in some embodiments (i.e., reading a physical page without reading a logical page). In this scenario, controller 122 reads all data contained in page(s) in flash volume(s) 120 and ignores any boundaries between logical pages. In some embodiment, controller 122 can perform physical reads of individual codeword instead of reading an entire page. Physical reads, as opposed to logical reads, can allow for restoration of data in some situations and help to determine the reliability of flash volume(s) 120.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The term(s) "Smalltalk" and the like may be subject to trademark rights in various jurisdictions throughout the world and are used here only in reference to the products or services properly denominated by the marks to the extent that such trademark rights may exist.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method for programming flash memory, the method comprising:
   packing, by one or more storage controllers, a non-integer count of logical pages into a first codeword payload data container such that the first codeword payload data container includes (i) a first logical page that is a self-contained type of logical page, wherein the self-contained type of logical page represents a type of logical page that does not straddle respective codeword payload data container boundaries and (ii) a first portion of a second logical page;
   associating, by one or more storage controllers, a first set of validation bits with the first logical page that is packed into the first codeword payload data container, wherein the first set of validation bits describes the arrangement of the first logical page in the first codeword payload data container with respect to a first boundary of the first codeword payload data container and a second boundary of the first codeword payload data container;
   associating, by one or more storage controllers, a second set of validation bits with the second logical page that is packed, at least in part, into the first codeword payload data container, wherein the second set of validation bits describes the arrangement of the second logical page in the first codeword payload data container with respect to a first boundary of the first codeword payload data container and a second boundary of the first codeword payload data container;

generating, by one or more storage controllers, a codeword payload header that includes an offset to the first portion of the second logical page packed, at least in part, into the first codeword payload data container;

concatenating, by one or more storage controllers, the first codeword payload data container and the codeword payload header to generate a codeword payload;

generating, by one or more storage controllers, error-correcting code data based, at least in part, on the codeword payload using a systematic error-correcting code;

concatenating, by one or more storage controllers, the codeword payload and error-correcting code data to generate a codeword; and programming, by one or more storage controllers, a physical page with the codeword.

2. The method of claim 1, wherein a second portion of the second logical page is packed into a second codeword payload data container, the second logical page thereby straddling a boundary of the first codeword payload data container and a boundary of the second codeword payload data container.

3. The method of claim 1, wherein the first logical page is aligned with the first boundary of the first codeword payload data container and the second logical page straddles the second boundary of the first codeword payload data container.

4. The method of claim 1, wherein the physical page stores a non-zero integer count of codewords.

5. The method of claim 1, wherein:
a codeword payload data container size is greater than one multiple of a logical page size and less than two multiples of the logical page size;
the first set of validation bits and the second set of validation bits each include at least two bits; and
permutations of the first set of validation bits and the second set of validation bits are respectively associated with arrangements of the first logical page and the second logical page in the first codeword payload data container.

6. A computer program product for programming flash memory, the computer program product comprising:
a computer readable storage device and program instructions stored on the computer readable storage device, the program instructions comprising:
program instructions to pack a non-integer count of logical pages into a first codeword payload data container such that the first codeword payload data container includes (i) a first logical page that is a self-contained type of logical page, wherein the self-contained type of logical page represents a type of logical page that does not straddle respective codeword payload data container boundaries and (ii) a first portion of a second logical page;
program instruction to associate a first set of validation bits with the first logical page that is packed into the first codeword payload data container, wherein the first set of validation bits describes the arrangement of the first logical page in the first codeword payload data container with respect to a first boundary of the first codeword payload data container and a second boundary of the first codeword payload data container;
program instructions to associate a second set of validation bits with the second logical page that is packed, at least in part, into the first codeword payload data container, wherein the second set of validation bits describes the arrangement of the second logical page in the first codeword payload data container with respect to a first boundary of the first codeword payload data container and a second boundary of the first codeword payload data container;
program instructions to generate a codeword payload header that includes an offset to the first portion of the second logical page packed, at least in part, into the first codeword payload data container;
program instructions to concatenate the first codeword payload data container and the codeword payload header to generate a codeword payload;
program instructions to generate error-correcting code data based, at least in part, on the codeword payload using a systematic error-correcting code;
program instructions to concatenate the codeword payload and error-correcting code data to generate a codeword; and
program instructions to program a physical page with the codeword.

7. The computer program product of claim 6, wherein a second portion of the second logical page is packed into a second codeword payload data container, the second logical page thereby straddling a boundary of the first codeword payload data container and a boundary of the second codeword payload data container.

8. The computer program product of claim 6, wherein the first logical page is aligned with the first boundary of the first codeword payload data container and the second logical page straddles the second boundary of the first codeword payload data container.

9. The computer program product of claim 6, wherein the physical page stores a non-zero integer count of codewords.

10. The computer program product of claim 6, wherein:
a codeword payload data container size is greater than one multiple of a logical page size and less than two multiples of the logical page size;
the first set of validation bits and the second set of validation bits each include at least two bits; and
permutations of the first set of validation bits and the second set of validation bits are respectively associated with arrangements of the first logical page and the second logical page in the first codeword payload data container.

11. A computer system for programming flash memory, the computer system comprising:
one or more storage controllers;
one or more computer readable storage devices;
program instructions stored on the computer readable storage devices for execution by at least one of the one or more storage controllers, the program instructions comprising:
program instructions to pack a non-integer count of logical pages into a first codeword payload data container such that the first codeword payload data container includes (i) a first logical page that is a self-contained type of logical page, wherein the self-contained type of logical page represents a type of logical page that does not straddle respective codeword payload data container boundaries and (ii) a first portion of a second logical page;

program instruction to associate a first set of validation bits with the first logical page that is packed into the first codeword payload data container, wherein the first set of validation bits describes the arrangement of the first logical page in the first codeword payload data container with respect to a first boundary of the first codeword payload data container and a second boundary of the first codeword payload data container;

program instructions to associate a second set of validation bits with the second logical page that is packed, at least in part, into the first codeword payload data container, wherein the second set of validation bits describes the arrangement of the second logical page in the first codeword payload data container with respect to a first boundary of the first codeword payload data container and a second boundary of the first codeword payload data container;

program instructions to generate a codeword payload header that includes an offset to the first portion of the second logical page packed, at least in part, into the first codeword payload data container;

program instructions to concatenate the first codeword payload data container and the codeword payload header to generate a codeword payload;

program instructions to generate error-correcting code data based, at least in part, on the codeword payload using a systematic error-correcting code;

program instructions to concatenate the codeword payload and error-correcting code data to generate a codeword; and program instructions to program a physical page with the codeword.

12. The computer system of claim 11, wherein wherein a second portion of the second logical page is packed into a second codeword payload data container, the second logical page thereby straddling a boundary of the first codeword payload data container and a boundary of the second codeword payload data container.

13. The computer system of claim 11, wherein the first logical page is aligned with the first boundary of the first codeword payload data container and the second logical page straddles the second boundary of the first codeword payload data container.

14. The computer system of claim 11, wherein:
a codeword payload data container size is greater than one multiple of a logical page size and less than two multiples of the logical page size;
the first set of validation bits and the second set of validation bits each include at least two bits; and
permutations of the first set of validation bits and the second set of validation bits are respectively associated with arrangements of the first logical page and the second logical page in the first codeword payload data container.

15. The method of claim 1, wherein each set of validation bits is a set of two validation bits in which a first validation bit and a second validation bit each have a first state and a second state, and wherein:
a first permutation in which the first and second validation bits are each of the first state represents a logical page of the self-contained type of logical page;
a second permutation in which the first validation bit is of the first state and the second validation bit is of the second state represents a logical page that straddles into a respective codeword payload data container; and
a third permutation in which the first validation bit is of the second state and the second validation bit is of the first state represents a logical page that straddles out of the respective codeword payload data container.

16. The method of claim 1, wherein each set of validation bits is a set of two validation bits in which a first validation bit and a second validation bit each have a first state and a second state, and wherein:
a first permutation in which the first and second validation bits are each of the first state represents a logical page of the self-contained type of logical page that is not aligned with a first boundary of a respective codeword payload data container and a second boundary of the respective codeword payload data container;
a second permutation in which the first validation bit is of the first state and the second validation bit is of the second state represents a logical page of the self-contained type of logical page that is aligned with the first boundary of the respective codeword payload data container;
a third permutation in which the first validation bit is of the second state and the second validation bit is of the first state represents a logical page of the self-contained type of logical page that is aligned with the second boundary of the respective codeword payload data container; and
a fourth permutation in which the first validation bit is of the second state and the second validation bit is of the second state represents a logical page that straddles across one of the first boundary and the second boundary of the respective codeword payload data container.

17. The computer program product of claim 6, wherein each set of validation bits is a set of two validation bits in which a first validation bit and a second validation bit each have a first state and a second state, and wherein:
a first permutation in which the first and second validation bits are each of the first state represents a logical page of the self-contained type of logical page;
a second permutation in which the first validation bit is of the first state and the second validation bit is of the second state represents a logical page that straddles into a respective codeword payload data container; and
a third permutation in which the first validation bit is of the second state and the second validation bit is of the first state represents a logical page that straddles out of the respective codeword payload data container.

18. The computer program product of claim 6, wherein each set of validation bits is a set of two validation bits in which a first validation bit and a second validation bit each have a first state and a second state, and wherein:
a first permutation in which the first and second validation bits are each of the first state represents a logical page of the self-contained type of logical page that is not aligned with a first boundary of a respective codeword payload data container and a second boundary of the respective codeword payload data container;
a second permutation in which the first validation bit is of the first state and the second validation bit is of the second state represents a logical page of the self-contained type of logical page that is aligned with the first boundary of the respective codeword payload data container;
a third permutation in which the first validation bit is of the second state and the second validation bit is of the first state represents a logical page of the self-contained type of logical page that is aligned with the second boundary of the respective codeword payload data container; and a fourth permutation in which the first validation bit is of the second state and the second validation bit is of the second state represents a logical page that straddles across one of the first boundary and the second boundary of the respective codeword payload data container.

19. The computer system of claim 11, wherein each set of validation bits is a set of two validation bits in which a first validation bit and a second validation bit each have a first state and a second state, and wherein:

a first permutation in which the first and second validation bits are each of the first state represents a logical page of the self-contained type of logical page;

a second permutation in which the first validation bit is of the first state and the second validation bit is of the second state represents a logical page that straddles into a respective codeword payload data container; and a third permutation in which the first validation bit is of the second state and the second validation bit is of the first state represents a logical page that straddles out of the respective codeword payload data container.

20. The computer system of claim 11, wherein each set of validation bits is a set of two validation bits in which a first validation bit and a second validation bit each have a first state and a second state, and wherein:

a first permutation in which the first and second validation bits are each of the first state represents a logical page of the self-contained type of logical page that is not aligned with a first boundary of a respective codeword payload data container and a second boundary of the respective codeword payload data container;

a second permutation in which the first validation bit is of the first state and the second validation bit is of the second state represents a logical page of the self-contained type of logical page that is aligned with the first boundary of the respective codeword payload data container;

a third permutation in which the first validation bit is of the second state and the second validation bit is of the first state represents a logical page of the self-contained type of logical page that is aligned with the second boundary of the respective codeword payload data container; and a fourth permutation in which the first validation bit is of the second state and the second validation bit is of the second state represents a logical page that straddles across one of the first boundary and the second boundary of the respective codeword payload data container.

* * * * *